(12) United States Patent
Zhou et al.

(10) Patent No.: US 7,859,330 B2
(45) Date of Patent: *Dec. 28, 2010

(54) OPTIMIZED UPLINK EFFICIENCIES FOR TRANSMISSION OF SATELLITE DATA

(75) Inventors: Guangcai Zhou, Agoura Hills, CA (US); Tung-Sheng Lin, Claremont, CA (US); Dennis Lai, Cerritos, CA (US); Joseph Santoru, Agoura Hills, CA (US); Ernest C. Chen, San Pedro, CA (US); Shamik Maitra, Redondo Beach, CA (US); Cecilia Comeaux, Redondo Beach, CA (US)

(73) Assignee: The DIRECTV Group, Inc., El Segundo, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/421,485

(22) Filed: Apr. 9, 2009

(65) Prior Publication Data

US 2009/0224824 A1    Sep. 10, 2009

Related U.S. Application Data

(63) Continuation of application No. 11/870,955, filed on Oct. 11, 2007, now Pat. No. 7,535,292.

(60) Provisional application No. 60/852,140, filed on Oct. 17, 2006.

(51) Int. Cl.
*G01R 19/00* (2006.01)
(52) U.S. Cl. .............................. 330/2; 330/98
(58) Field of Classification Search .................. 330/2, 330/98, 310, 150
See application file for complete search history.

(56) References Cited

U.S. PATENT DOCUMENTS

| 6,255,908 | B1 |   | 7/2001  | Ghannouchi et al. |
|-----------|----|---|---------|-------------------|
| 6,834,073 | B1 | * | 12/2004 | Miller et al. ................ 375/130 |
| 7,404,640 | B2 | * | 7/2008  | Ferguson et al. ............ 351/221 |
| 2003/0222654 | A1 |   | 12/2003 | Furse et al. |

OTHER PUBLICATIONS

Kullstam, Per and Oetting, John; "A New Model for Computing the Intermodulation Signal Spectra for a Nonlinear Amplifier"; 2003 IEEE Military Communications Conference; Milcom 2003; Boston, Massachusetts, USA; Oct. 13-16, 2003; IEEE Military Communications Conference; New York, New York; USA; vol. 2 of 2; Oct. 13, 2003; pp. 30-35; XP010698210; ISBN: 0-7803-8140-8.
International Search Report and Written Opinion dated Apr. 23, 2008 in International Application No. PCT/US2007/021955 corresponding to US Appl. No. 11/870,955 filed Oct. 11 2007 by Guangcai Zhou et al.

* cited by examiner

*Primary Examiner*—Henry K Choe

(57) ABSTRACT

Systems and methods for characterizing amplifiers. A system for characterizing an amplifier in accordance with the present invention comprises a Gaussian signal source for generating a signal in the frequency domain, a notch filter, coupled to the Gaussian Noise source, wherein the notch filter has a notch at a specified frequency and a frequency bandwidth, the frequency bandwidth encompassing the specified frequency, an Inverse Fast Fourier Transform device, coupled to an output of the notch filter, a normalization device, coupled to the Inverse Fast Fourier Transform device, an amplifier under test, coupled to the normalization device, for amplifying the signal generated by the Gaussian signal source, and a measurement device, coupled to an output of the amplifier, for measuring a power output of the amplifier in the frequency bandwidth and a noise output at the specified notch frequency, and for calculating the ratio between the power output and the noise output.

20 Claims, 5 Drawing Sheets

OPTIMIZED UPLINK EFFICIENCIES FOR TRANSMISSION OF SATELLITE DATA

CROSS-REFERENCE TO RELATED APPLICATIONS

This application is a continuation of U.S. utility patent application Ser. No. 11/870,955, filed Oct. 11, 2007, which claims the benefit under 35 U.S.C. Section 119(e) of U.S. provisional patent application Ser. No. 60/852,140 filed Oct. 17, 2006, entitled "OPTIMIZED UPLINK EFFICIENCIES FOR TRANSMISSION OF SATELLITE DATA," by Guangcai Zhou et al., which application is incorporated by reference herein.

BACKGROUND OF THE INVENTION

1. Field of the Invention

The present invention relates generally to a satellite broadcast system, and in particular, to optimizing transmitter uplink power efficiency for such a satellite broadcast system.

2. Description of the Related Art

Satellite broadcasting of communications signals has become commonplace. Satellite distribution of commercial signals for use in television programming currently utilizes multiple feedhorns on a single Outdoor Unit (ODU) which supply signals to several Integrated Receiver & Decoders (IRDs) on separate cables from a multiswitch.

FIG. 1 illustrates an example satellite television broadcast system of the related art.

System 100 uses signals sent from Satellite A (SatA) 102, Satellite B (SatB) 104, and Satellite C (SatC) 106 (with transponders 28, 30, and 32 converted to transponders 8, 10, and 12, respectively), that axe directly broadcast to an Outdoor Unit (ODU) 108 that is typically attached to the outside of a house 110. ODU 108 receives these signals and sends the received signals to IRD 112, which decodes the signals and separates the signals into viewer channels, which are then passed to television 114 for viewing by a user. There can be more than one satellite transmitting from each orbital location.

Satellite uplink signals 116 are transmitted by one or more uplink facilities 118 to the satellites 102-106 that are typically in geosynchronous orbit. Satellites 102-106 amplify and rebroadcast the uplink signals 116, through transponders located on the satellite, as downlink signals 120. Depending on the satellite 102-106 antenna pattern, the downlink signals 120 are directed towards geographic areas for reception by the ODU 108.

Each satellite 102-106 broadcasts downlink signals 120 in typically thirty-two (32) different sets of frequencies, often referred to as transponders, which are licensed to various users for broadcasting of programming, which can be audio, video, or data signals, or any combination. These signals have typically been located in the Ku-band Fixed Satellite Service (FSS) and Broadcast Satellite Service (BSS) bands of frequencies in the 10-13 GHz range. Other satellites may also broadcast in a portion of the Ka-band with frequencies of 18-21 GHz. Alternatively, signals can be transmitted in series or in parallel via cable 122 to IRD 112.

The uplink signals 116 power is limited and frequency allocations are fixed in size and, thus, the power and bandwidth for transmission in those frequency bands limit the ability of the system 100 to transmit additional signals using the current transmission and receiving method. With additional satellites and additional channels, more signals must be transmitted within the power and bandwidth constraints to allow for additional programming within system 100.

It can be seen, then, that there is a need in the art for a satellite broadcast system to increase the power and spectral efficiency with the allocated bandwidth.

SUMMARY OF THE INVENTION

To minimize the limitations in the prior art, and to minimize other limitations that will become apparent upon reading and understanding the present specification, the present invention discloses systems and methods for characterizing amplifiers in a multi-carrier environment. A system for characterizing an amplifier in accordance with the present invention comprises a Gaussian signal source for generating a signal in the frequency domain, a notch filter, coupled to the Gaussian Noise source, wherein the notch filter has a notch at a specified frequency and a frequency bandwidth, the frequency bandwidth encompassing the specified frequency, an Inverse Fast Fourier Transform device, coupled to an output of the notch filter, a normalization device, coupled to the Inverse Fast Fourier Transform device, an amplifier under test, coupled to the normalization device, for amplifying the signal generated by the Gaussian signal source, and a measurement device, coupled to an output of the amplifier, for measuring a power output of the amplifier in the frequency bandwidth and a noise output at the specified notch frequency, and for calculating the ratio between the power output and the noise output.

Such a system further optionally comprises the characterized amplifier being used in a satellite communications system, and the satellite communications system is a direct broadcast system for television signals.

A method in accordance with the present invention comprises supplying a Gaussian signal in the frequency domain, notch filtering the Gaussian signal, wherein the notch filter has a notch at a specified frequency and a frequency bandwidth, the frequency bandwidth encompassing the specified frequency, applying an Inverse Fast Fourier Transform to the notch filtered Gaussian signal to transform the Gaussian signal into a time domain signal, normalizing the time domain signal to a specified power level into the amplifier, applying the normalized time domain signal to an input of the amplifier under test for its nonlinear effects on a multi-carrier signal, measuring a power output of the amplifier in the frequency bandwidth and a noise output at the specified notch frequency, and calculating the ratio between the power output and the noise output.

Such a method further optionally comprises the characterized amplifier being used in a satellite communications system, and the satellite communications system is a direct broadcast system for television signals.

Other features and advantages are inherent in the system and method claimed and disclosed or will become apparent to those skilled in the art from the following detailed description and its accompanying drawings.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which show, by way of illustration, several embodiments of the present invention. It is understood that other embodiments may be utilized and structural changes may be made without departing from the scope of the present invention.

Overview

The present invention provides a new figure-of-merit to measure the efficiency and suitability for a transmitter in a communications system. Traditionally, the figures-of-merit used to characterize a transmitter, e.g., a High Power Amplifier (HPA) or Travelling Wave Tube Amplifier (TWTA), is the third order intermodulation product, known as C3IM, and the Adjacent Channel Power Ratio (ACPR).

However, other figures-of-merit may provide more efficiency for a given system than C3IM or ACPR. For example, Noise-Power Ratio (NPR), as described herein in the present invention, may help to ensure enough effective power from the TWTA or HPA to still transmit the data without excessive errors to the satellite 120, which will help to ensure proper and acceptable reception of the transmitted data at IRD 112.

Such an approach significantly increases the power and spectral efficiency of a system 100 that has a large number of transmitters.

Particulars of the Present Invention

Figure 1:
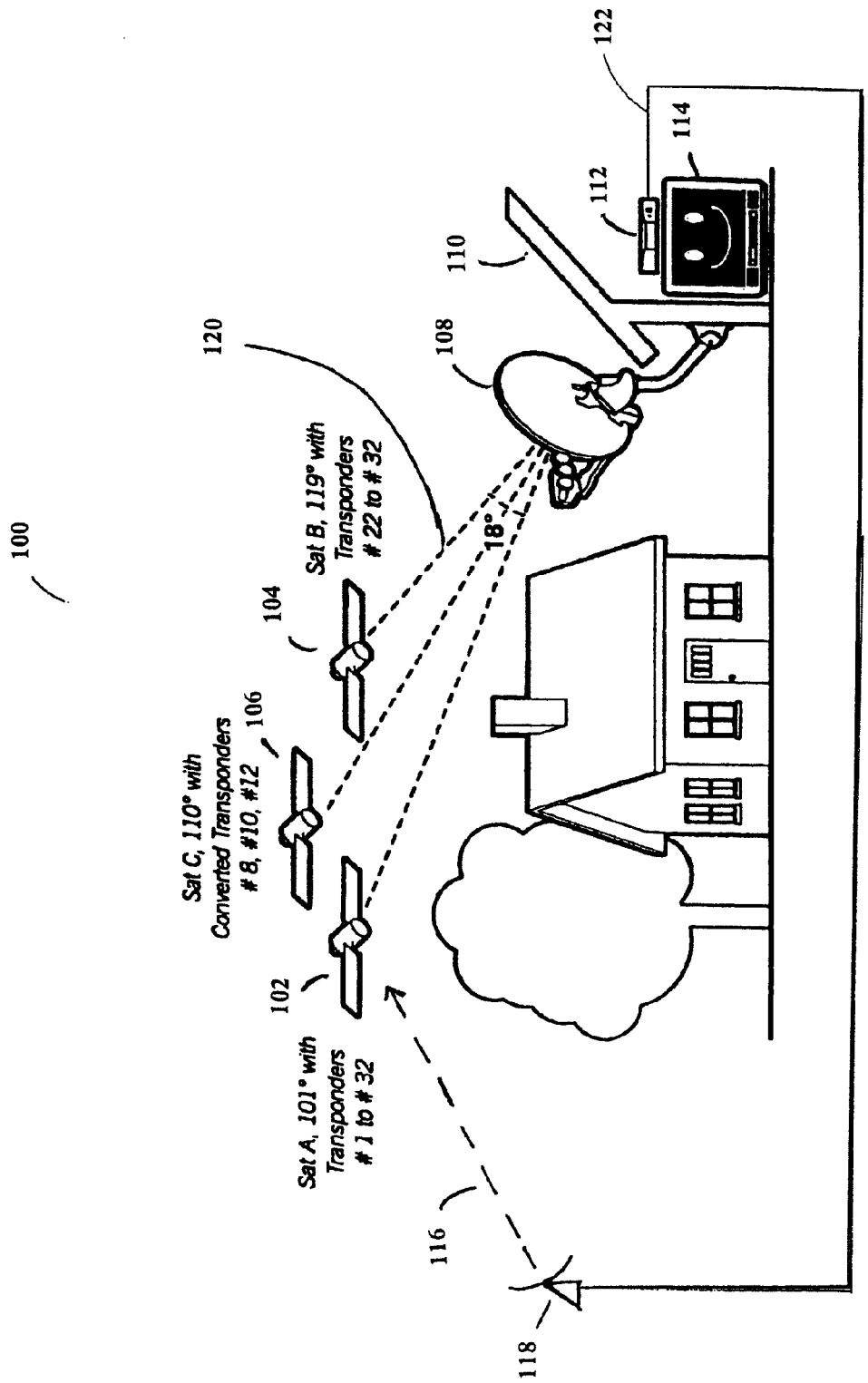
FIG. 1 illustrates a typical satellite television broadcast system of the related art.
Figure 2:
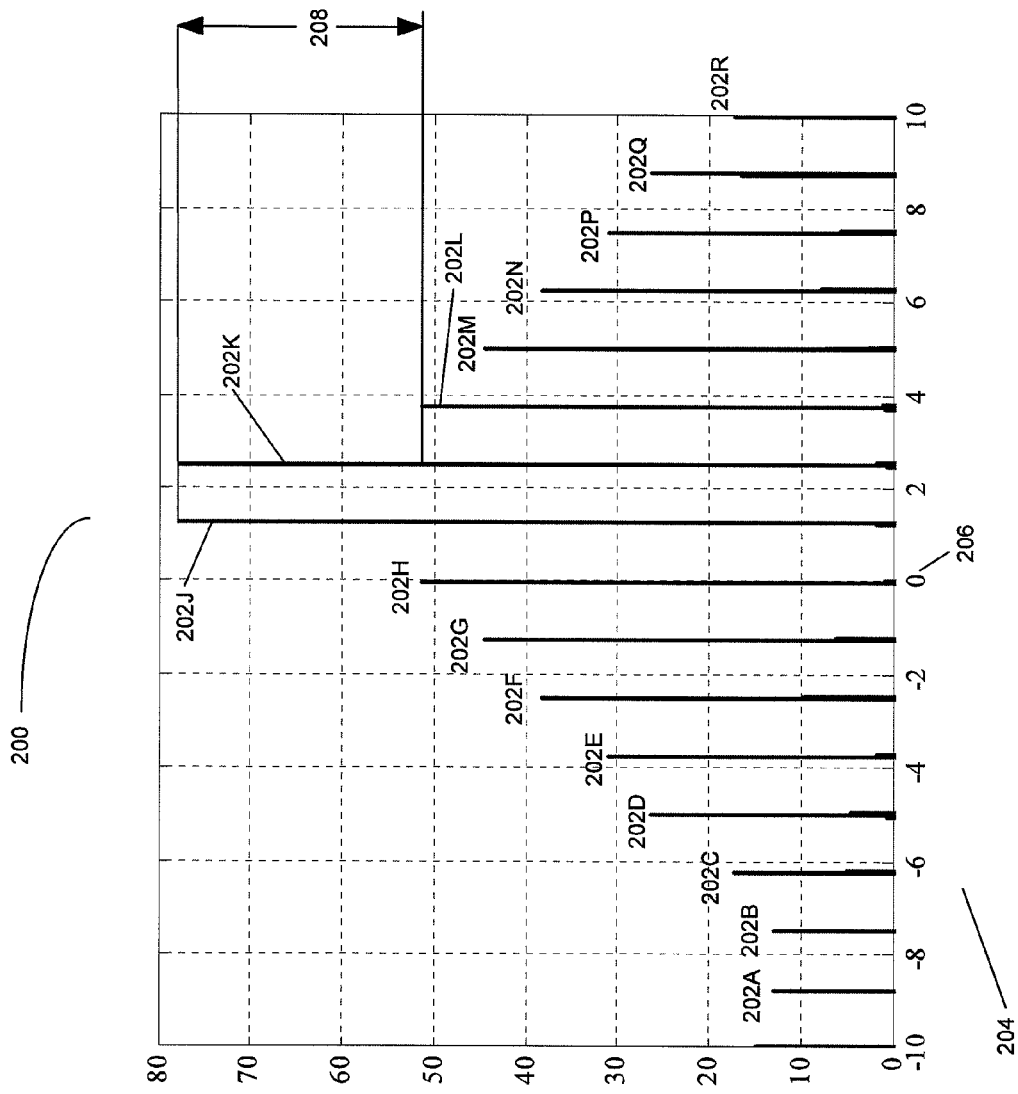
FIG. 2 illustrates a typical measurement of C3IM.

FIG. 2 illustrates a typical measurement of C3IM.

Amplifier manufacturers typically supply data sheets for HPA and TWTA devices that are specific to the device itself. For example, the manufacturer will run tests on the amplifier to give the end user some specific data on how that amplifier will operate, the bandwidth, the power output value, the nonlinearity, etc. These data points will typically be verified by the end user through testing at the user facility. Non-linearity is typically expressed in terms of C3IM, Graph 200 shows a series of relative output values 202A-202R, in dB, for a given amplifier. The horizontal axis of the graph is in MHz. The inputs to this amplifier were two frequencies (two-tone), for example f1=1.25 MHz and f2=2.5012 MHz. Output values were generated at various frequencies 204, with a center frequency at the center of the transmission channel in system 200. Outputs 202J and 202K are at the two-tone input frequencies and are the highest power outputs for this amplifier. 2f1-f2 and 2f2-f1 are the next highest outputs from nonlinear effects of the amplifier. Digitized amplifier output time samples are Fast Fourier Transformed (FFT'd), and the input power is varied to obtain optimum tradeoff between output power and nonlinearity from the graph. The input power reduction to obtain the desired output linearity with a reduced output power is called the Input Back-Off (IBO), which is the ratio between the input power that delivers maximum power and the operating input power that delivers the desired nonlinearity tradeoff. IBO values typically range from 0 to 25 dB.

To determine C3IM for this amplifier, the difference between the highest peak, in this case 202J and 202K, and the next adjacent highest peak, in this case 202H and 202L, gives the C3IM value 208, measured in dB.

Figure 3:
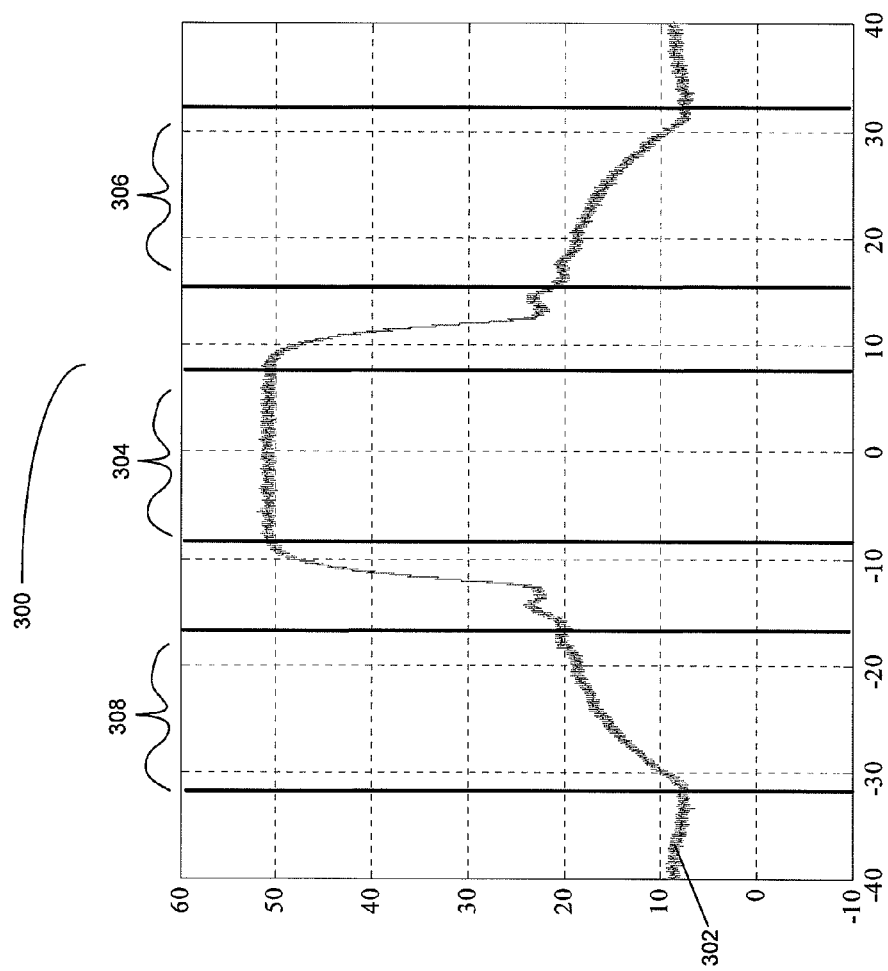
FIG. 3 illustrates a typical measurement of ACPR.

FIG. 3 illustrates a typical measurement of ACPR with a modulated input signal.

Graph 300 illustrates the output power 302 of a given amplifier, with an input of a Quadrature Phased Shift Keyed (QPSK) signal with a symbol rate of 20 MHz and a Root Raised Cosine Factor (RRCF) of 0.2. The sampling frequency for this example is 320 MHz, which is sufficient to cover most significant nonlinear effects in the signal spectrum. The horizontal axis of the graph is in MHz. The in-band Power Spectral Density (PSD) 304 is shown, and the Upper Adjacent Channel PSD 306 and Lower Adjacent Channel PSD 308 are also shown.

The ACPR is determined by taking the in-band PSD 304 and dividing by the sum of the Upper Adjacent Channel PSD 306 and Lower Adjacent Channel PSD 308.

Figure 4:
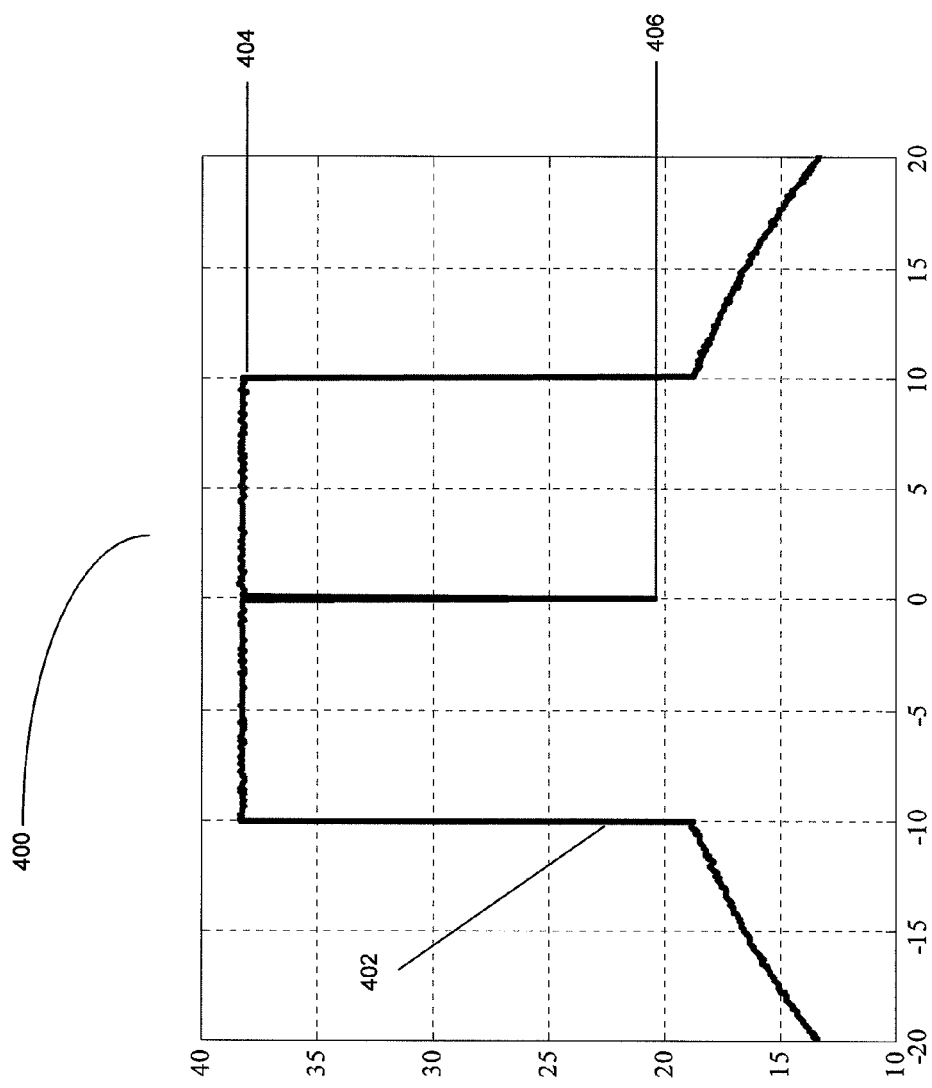
FIG. 4 illustrates a measurement of NPR in accordance with the present invention.

FIG. 4 illustrates a measurement of NPR in accordance with the present invention. The horizontal axis is in MHz and the vertical axis is in dB.

Graph 400 illustrates the output 402 of an amplifier with a zero-mean and unit-variance Gaussian input generated in the frequency domain, sampled at 160 MHz. The sampling rate can be varied as desired. A notch filter is applied to the input signal, with a zero (null) at or close to DC, and a 1 elsewhere from −10 MHz to 10 MHz. An Inverse Fast Fourier Transform (IFFT) transforms the digitized input to the time domain for testing the nonlinearity of the amplifier The NPR is calculated as the power at point 404 divided by the power at point 406.

Figure 5:
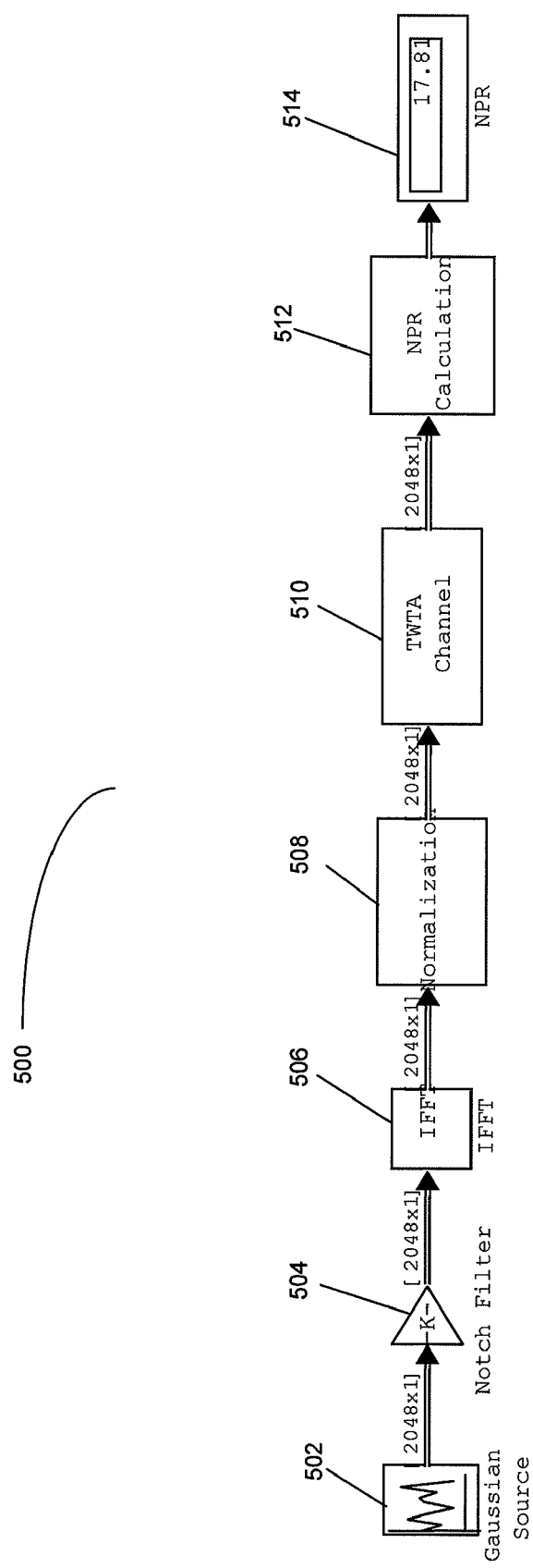
FIG. 5 illustrates a typical apparatus for measuring NPR in accordance with the present invention.

FIG. 5 illustrates a typical apparatus for measuring NPR in accordance with the present invention.

System 500 shows a Gaussian source 502, a notch filter 504, an IFFT 506, a normalization block 508, an amplifier/ amplifier channel under test 510, and the NPR calculation 512 with resultant NPR 514. The Gaussian source 502 is used as an input, and can be adjusted in its power to effect an IBO of 0 to 25 dB to allow for a NPR measurement at the output of the amplifier 510. The Gaussian noise is 20 MHz wide, centered at 0 Hz (and up-converted to the operating frequency of the amplifier), with a notch at or close to DC and a 1 from −10 MHz to +10 MHz. The notch can appear anywhere in the bandwidth, at any specified frequency or frequency range, but is typically centered within the Gaussian noise bandwidth. The notch bandwidth can be specified as desired.

The Gaussian Source 502 output is fed through the notch filter 504 and then transformed to the time domain by the IFFT 506. The output in the time domain is normalized by normalization block 508, and then input to the amplifier/ amplifier channel 510. The graph of FIG. 4 is the result, where point 406 is generated by the notch at DC of filter 504, and the normalized output 404 is generated by the amplifier 510.

The NPR calculation takes points 404 and 406, which take into account the nonlinearities of the amplifier 510 for a multi-carrier signal, and determines the output power of the amplifier 510 with respect to the power of the input signal 502 as well as the inherent non-linearity of the amplifier 510 as it impacts a multi-carrier signal. Other measurements do not take these factors into account, which means that the amplifier 510 is not measured with respect to the end usage of amplifier 510, e.g., to transmit a multi-carrier signal to a satellite.

Because of the NPR 514 accounting for the non-linearities of the system 100 and amplifier 510, amplifiers 510 used in system 100 can be arranged and set such that the signal strength of the signal amplified by the amplifier 510 is within a given range of all other signals being received by the satellite. Since satellites receive signals from various amplifiers, and, possibly, various uplink sites, the dynamic range of the signals being received by the satellite must be small such that the satellite receive electronics do not apply too much gain to the received signals. The Automatic Gain Control (AGC) attached to the receive antenna on the satellites can only amplify or attenuate signals over a certain range. Since NPR measurement 514 gives a measurement of power output (for the data) versus the noise (of the amplifier and input signals combined), the power output of the amplifier 510 can be finely tuned such that all amplifiers 510 being used in the system can deliver signal strengths to the satellite that are within a certain dynamic range and still deliver all of the data required without undesirable error rates or inter-symbol interferences.

CONCLUSION

In summary, the present invention comprises systems and methods for characterizing amplifiers. A system for characterizing an amplifier in accordance with the present invention comprises a Gaussian signal source for generating a signal in the frequency domain, a notch filter, coupled to the Gaussian Noise source, wherein the notch filter has a notch at a specified frequency and a frequency bandwidth, the frequency bandwidth encompassing the specified frequency, an Inverse Fast Fourier Transform device, coupled to an output of the notch filter, a normalization device, coupled to the Inverse Fast Fourier Transform device, an amplifier under test for its nonlinearity, coupled to the normalization device, for amplifying the time-domain signal originally generated by the Gaussian signal source, and a measurement device, coupled to an output of the amplifier, for measuring a power output of the amplifier in the frequency bandwidth and a noise output at the specified frequency, and for calculating the ratio between the power output and the noise output in the notch filter.

Such a system further optionally comprises the amplifier being used in a satellite communications system, and the satellite communications system is a direct broadcast system for television signals.

A method in accordance with the present invention comprises supplying a Gaussian signal, notch filtering the Gaussian signal, wherein the notch filter has a notch at a specified frequency and a frequency bandwidth, the frequency bandwidth encompassing the specified frequency, applying an Inverse Fast Fourier Transform to the notch filtered Gaussian signal to transform the Gaussian signal into a time domain signal, normalizing the time domain signal, applying the normalized time domain signal to an input of the amplifier, measuring a power output of the amplifier in the frequency bandwidth and a noise output at the specified frequency, and calculating the ratio between the power output and the noise output.

Such a method further optionally comprises the amplifier being used in a satellite communications system, and the satellite communications system is a direct broadcast system for television signals.

It is intended that the scope of the invention be limited not by this detailed description, but rather by the claims appended hereto and the equivalents thereof. The above specification, examples and data provide a complete description of the manufacture and use of the composition of the invention. Since many embodiments of the invention can be made without departing from the spirit and scope of the invention, the invention resides in the claims hereinafter appended and the equivalents thereof.

What is claimed is:

1. A system for characterizing an amplifier across a frequency bandwidth, comprising:
    a signal source for generating a signal in the frequency domain;
    a notch filter, coupled to the signal source, the notch filter having a notch at a notch frequency;
    an amplifier under test, coupled to the normalization device, for amplifying the signal generated by the signal source; and
    a measurement device, coupled to an output of the amplifier, for measuring a power output of the amplifier in the frequency bandwidth and a noise output at the notch frequency, and for calculating a ratio between the power output and the noise output.

2. The system of claim 1, wherein the signal source is a Gaussian source.

3. The system of claim 2, wherein the Gaussian source is upconverted to an operating frequency of the amplifier.

4. The system of claim 1, wherein the notch frequency is centered in the frequency bandwidth.

5. The system of claim 4, wherein the notch has a specified bandwidth.

6. The system of claim 1, further comprising an Inverse Fast Fourier Transform device, coupled to an output of the notch filter, such that the measurement device calculates the ratio in a time domain.

7. The system of claim 1, further comprising a normalization device, coupled to the Inverse Fast Fourier Transform device, for normalizing an output of the Inverse Fast Fourier Transform device.

8. The system of claim 1, wherein the amplifier is used in a satellite communications system.

9. The system of claim 8, wherein the satellite communications system is a direct broadcast system for television signals.

10. A method for characterizing an amplifier across a frequency bandwidth, comprising:
    notch filtering a Gaussian input signal to the amplifier, wherein the notch filtering comprises notching the Gaussian input signal at a specified frequency across the frequency bandwidth;
    measuring a power output of the amplifier across the frequency bandwidth and a noise output at the specified frequency; and
    calculating the ratio between the power output and the noise output.

11. The method of claim 10, wherein the specified frequency is centered in the frequency bandwidth.

12. The method of claim 11, wherein the specified frequency has a specified bandwidth.

13. The method of claim 10, further comprising transforming the notch filtered Gaussian signal into a time domain signal.

14. The method of claim 13, further comprising normalizing the time domain signal.

15. The method of claim 10, wherein the amplifier is used in a satellite communications system.

16. The method of claim 15, wherein the satellite communications system is a direct broadcast system for television signals.

17. A measurement device for characterizing an amplifier across a frequency bandwidth, comprising:
    a Gaussian signal source for generating a signal in the frequency domain, the Gaussian signal source being upconverted to an operating frequency of the amplifier;
    a notch filter, coupled to the Gaussian signal source, the notch filter having a notch at a notch frequency; and
    a measurement device, coupled to an output of the amplifier, for measuring a power output of the amplifier across the frequency bandwidth and a noise output at the notch frequency, and for calculating a ratio between the power output and the noise output.

18. The measurement device of claim 17, wherein the power output and the noise output are measured in a time domain.

19. The measurement device of claim 17, wherein the Gaussian signal source has an adjustable power output.

20. The measurement device of claim 17, wherein the amplifier is characterized for use in a satellite communications system.

\* \* \* \* \*